United States Patent
Tani et al.

(10) Patent No.: US 9,853,009 B2
(45) Date of Patent: Dec. 26, 2017

(54) SEMICONDUCTOR MODULE HAVING A CONDUCTOR MEMBER FOR REDUCING THERMAL STRESS

(71) Applicant: Mitsubishi Electric Corporation, Tokyo (JP)

(72) Inventors: Masakazu Tani, Tokyo (JP); Yoshiyuki Deguchi, Tokyo (JP)

(73) Assignee: Mitsubishi Electric Corporation, Chiyoda-ku, Tokyo (JP)

(*) Notice: Subject to any disclaimer, the term of this patent is extended or adjusted under 35 U.S.C. 154(b) by 0 days.

(21) Appl. No.: 15/126,609

(22) PCT Filed: Apr. 4, 2014

(86) PCT No.: PCT/JP2014/060009
§ 371 (c)(1),
(2) Date: Sep. 16, 2016

(87) PCT Pub. No.: WO2015/151285
PCT Pub. Date: Oct. 8, 2015

(65) Prior Publication Data
US 2017/0084568 A1    Mar. 23, 2017

(51) Int. Cl.
*H01L 23/00* (2006.01)
*H01L 23/367* (2006.01)

(52) U.S. Cl.
CPC .......... *H01L 24/40* (2013.01); *H01L 23/3675* (2013.01); *H01L 24/36* (2013.01);
(Continued)

(58) Field of Classification Search
CPC ......... H01L 21/60; H01L 25/07; H01L 25/18; H01L 24/40; H01L 23/3675; H01L 24/84;
(Continued)

(56) References Cited

U.S. PATENT DOCUMENTS

2016/0035646 A1* 2/2016 Soyano .................. H01L 23/36
257/692

FOREIGN PATENT DOCUMENTS

DE    10 2009 020 733 A1    11/2010
JP    8-195411 A    7/1996
(Continued)

OTHER PUBLICATIONS

International Search Report for PCT/JP2014/060009 dated Jul. 15, 2014.
(Continued)

*Primary Examiner* — Alexander Oscar Williams
(74) *Attorney, Agent, or Firm* — Sughrue Mion, PLLC; Richard C. Turner

(57) ABSTRACT

In the semiconductor module according to the present invention, a conducting member which is used to electrically connect a semiconductor element arranged on a substrate or a bus bar with another electronic component is provided with a structure having flexibility capable of, in a junction with the semiconductor element, reducing the thermal stress due to difference in a coefficient of linear expansion between the conducting member and the semiconductor element, and absorbing dimensional error in objects to be connected. Therefore, the semiconductor module achieves both increased current capacity of the semiconductor device and improved reliability of the semiconductor module.

8 Claims, 1 Drawing Sheet

(52) U.S. Cl.
CPC .... *H01L 24/84* (2013.01); *H01L 2224/40139* (2013.01); *H01L 2224/40245* (2013.01); *H01L 2924/13055* (2013.01); *H01L 2924/13091* (2013.01)

(58) Field of Classification Search
CPC . H01L 2924/13055; H01L 2924/13091; H01L 2224/40139; H01L 2224/40245; H01L 24/36; H01L 2924/00
USPC .......................... 257/712, 713, 696, 698, 666
See application file for complete search history.

(56) References Cited

FOREIGN PATENT DOCUMENTS

| | | |
|---|---|---|
| JP | 10-340985 A | 12/1998 |
| JP | 2001-036001 A | 2/2001 |
| JP | 2004-319740 A | 11/2004 |
| JP | 2005-5593 A | 1/2005 |
| JP | 2005-093306 A | 4/2005 |
| JP | 2011-204968 A | 10/2011 |
| JP | 2013-26445 A | 2/2013 |
| JP | 2013-251500 A | 12/2013 |

OTHER PUBLICATIONS

Communication dated May 9, 2017 from the Japanese Patent Office in counterpart Application No. 2016-511296.
Communication dated Oct. 10, 2017 by the European Patent Office in a counterpart European Application No. 14888393.7.

\* cited by examiner

SEMICONDUCTOR MODULE HAVING A CONDUCTOR MEMBER FOR REDUCING THERMAL STRESS

CROSS REFERENCE TO RELATED APPLICATIONS

This application is a National Stage of International Application No. PCT/JP2014/060009 filed Apr. 4, 2014, the contents of which are incorporated herein by reference in their entirety.

TECHNICAL FIELD

The present invention relates to a semiconductor module using a conducting member which is an electrical wiring section, and more particularly, to a semiconductor module for achieving both increased current capacity and improved reliability.

BACKGROUND ART

A semiconductor module which is configured from an IGBT or MOS-FET that controls current switching is a principal constituent component of power conversion devices, such as inverters and chargers. With the advance of electric powered vehicles, there are demands for increased output from power conversion devices, and the current capacity of semiconductor modules is tending to increase.

Moreover, with advances of the semiconductor elements made of SiC, and the like, operation has become possible in high-temperature environments around 200° C. However, the structural reliability required in the cooling and heating cycle, etc. is much stricter than in the prior art. Therefore, semiconductor modules are required to both increase current capacity through higher output, and ensure reliability enabling normal operation over a long period of time in a high-temperature environment.

In order to increase the current capacity, it is essential to reduce the electrical resistance of the conducting members. Moreover, in order to ensure reliability from low-temperature to high-temperature environments, it is imperative to reduce the thermal stress in the junctions of the constituent members inside the semiconductor module, and to reduce the residual stress in these junctions.

In a conventional semiconductor module, in order to increase the current capacity, the electrodes of the semiconductor element and the bus bar constituting the main terminal are joined directly (see, for example, PTL 1).

CITATION LIST

Patent Literature

[PTL 1]
Japanese Patent Application Publication No. 2005-5593

SUMMARY OF INVENTION

Technical Problem

However, the prior art involves the following problems. The conventional bus bar disclosed in PTL 1 uses a metal plate having a high conductivity (for example, copper plate). In general, bus bars use copper in respect of the current capacity, but to achieve high output, the cross-sectional area is increased and the material often becomes rigid.

However, in the wiring structure in PTL 1, due to the large difference in thermal expansion between the semiconductor element and the bus bar, distortion occurs at the junction surfaces, and thermal stress arises. As a result of this, a problem occurs in that detachment and/or chip cracking, etc. occurs at the junction surfaces between the semiconductor element and the bus bar.

Furthermore, dimensional errors in the constituent members of the semiconductor module cannot be absorbed, and residual stress occurs at the junction surfaces of the semiconductor element and the bus bar. This residual stress is also a cause of defects such as detachment and chip cracking described above and hence is a problem in relation to reliability. Furthermore, in the bus bar, the high-frequency component has high electrical resistance and there are limits on the increase in the current capacity.

The present invention was devised in order to resolve the problems described above, an object thereof being to provide a semiconductor module which can both increase the current capacity of the semiconductor device and improve the reliability of the semiconductor module.

Solution to Problem

In the semiconductor module according to the present invention, a conducting member which is used to electrically connect a semiconductor element arranged on a substrate or a bus bar with another electronic component is provided with a structure having flexibility capable of, in a junction with the semiconductor element, reducing thermal stress due to difference in a coefficient of linear expansion between the conducting member and the semiconductor element, and absorbing dimensional error in objects to be connected.

Advantageous Effects of Invention

According to the present invention, a conducting member wherein thin metal wires are formed into a strand wire, or a conducting member made from a braided wire, or a conducting member in which sheet metal is layered, is used for the wiring of the semiconductor element. By adopting this configuration, it is possible to prevent problems caused by thermal stress due to the difference in the coefficient of linear expansion between the conducting member and the semiconductor element, while reducing the resistance of the high-frequency component and achieving a large current capacity in the electrical wiring, and therefore residual stress arising due to dimensional error in the semiconductor module can be reduced. As a result of this, it is possible to obtain a semiconductor module which achieves both increased current capacity of the semiconductor device and improved reliability of the semiconductor module.

DESCRIPTION OF EMBODIMENTS

Figure 1:
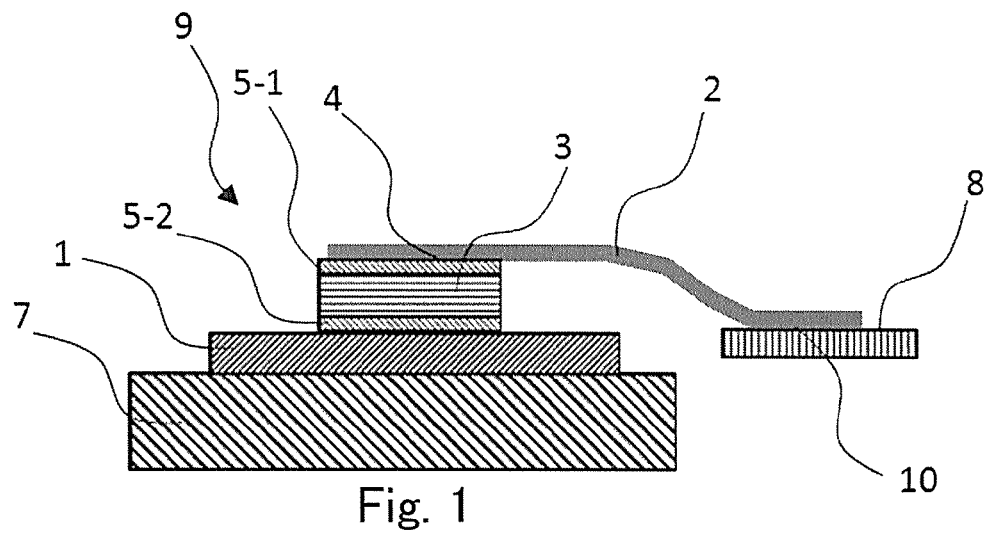
FIG. 1 is a cross-sectional diagram of a semiconductor module according to a first embodiment of the present invention.

Below, a preferred embodiment of a semiconductor module according to this invention is described with reference to the drawings. Parts which are the same or equivalent in the drawings are labelled with the same reference numerals.

First Embodiment

FIG. 1 is a cross-sectional diagram of a semiconductor module according to the first embodiment of the present invention. The semiconductor module 9 according to the first embodiment is configured from a semiconductor element 3 which is disposed on a substrate 1 (or bus bar), a conducting member 2 constituting a main terminal, and a heat radiating plate 7. The conducting member 2 is bonded to an upper-side electrode 5-1 of the semiconductor element 3 and a terminal 8 of an electrical component constituting a switching circuit.

Here, the conducting member 2 has a structure in which thin metal wires of copper or aluminum, etc. having high conductivity are formed into a strand wire. By adjusting the diameter and number of strand wires, it is possible to increase the current capacity of the electrical wiring section. The bonding method used may be ultrasonic bonding, solder bonding, Ag sinter bonding, conductive adhesive bonding, diffusion bonding, brazing, or another bonding method.

In the first embodiment, the conducting member 2 in which thin metal wires are formed into a strand wire has flexibility, and therefore the conducting member 2 deforms in accordance with the thermal expansion of the semiconductor element 3. Consequently, distortion does not occur at the bonding surface 4 between the conducting member 2 and the semiconductor element 3, and thermal stress does not arise due to the difference in the coefficient of linear expansion between the conducting member 2 and the semiconductor element 3.

Moreover, as shown in FIG. 1, even if there is a step difference in the height direction of the upper-side electrode 5-1 of the semiconductor element 3 and the terminal 8 of the electronic component, since the conducting member 2 has flexibility, it is possible to absorb dimensional error due to the step difference. As a result of this, it is possible to eliminate residual stress in the bonding surface 4 and the bonding surface 10.

Furthermore, a high-frequency current flows near the surface of the conducting member 2, due to a skin effect. Therefore, the electrical resistance of the high-frequency component tends to become higher. On the other hand, in the first embodiment, the conducting member 2 is configured from a group of thin wires or metal sheets, and therefore it is possible to increase the surface area compared to a conventional bus bar. As a result of this, it is possible to reduce the electrical resistance of the high-frequency component, and increase in the current capacity can be achieved.

As described above, according to the first embodiment, a conducting member having a structure in which thin metal wires of high conductivity are formed into a strand wire is used. Consequently, it is possible to use a conducting member which has flexibility and increased surface area, the current capacity may be increased in the electrical wiring section, and furthermore, detachment of the junctions due to thermal stress is prevented and improved reliability of the semiconductor module can be achieved.

Second Embodiment

In the first embodiment described above, a structure in which thin metal wires of high conductivity are formed into a strand wire is used for the conducting member 2 in order to achieve the object of imparting flexibility and increasing the surface area. On the other hand, in the second embodiment, in order to achieve the same object, a conductive member having a different structure to the first embodiment is used.

The conducting member 2 according to the second embodiment employs a structure in which thin metal wires are woven in the form of a mesh (called "braided wire" below). The cross-sectional shape of the conducting member 2 having a structure of this kind is a plate shape, elliptical shape or circular shape.

With a structure of this kind also, similarly to the first embodiment described above, it is possible to achieve the object of imparting flexibility and increasing the surface area. Consequently, it is possible both to increase the current capacity of the electrical wiring section, and to prevent detachment due to thermal stress.

According to the second embodiment, as described above, a structure in which thin metal wires are woven into a mesh shape is employed. Consequently, it is possible to use a conducting member which has flexibility and increased surface area, the current capacity may be increased in the electrical wiring section, and furthermore, detachment of the junctions due to thermal stress is prevented and improved reliability of the semiconductor module can be achieved.

Third Embodiment

In the first embodiment described above, a structure in which thin metal wires of high conductivity are formed into a strand wire is used for the conducting member 2 in order to achieve the object of imparting flexibility and increasing the surface area. Furthermore, in the second embodiment, a braided wire is used as the conducting member 2 in order to achieve the same object. On the other hand, in the third embodiment, in order to achieve the same object, a conductive member having a different structure to the first and second embodiments is used.

The conducting member 2 according to the third embodiment is configured by layering metal sheets, and adopts a structure in which the conducting member 2 is bonded to the semiconductor element 3 by aligning the layers of metal sheet. The metal sheets of the conducting member 2 having a structure of this kind are not fixed between the layers, except for at the bonding surfaces 4 and 10. By increasing the number of layers of sheet metal, it is possible to increase the current capacity in the electrical wiring.

By adopting a structure of this kind, the sheet metal constituting the conducting member 2 has flexibility and can deform in accordance with thermal expansion of the electrode 5-1 of the semiconductor element 3. Consequently, there is no distortion in the bonding surface 4 and thermal stress does not occur. Furthermore, by adopting a structure of this kind, similarly to the first and second embodiments described above, it is possible both to increase the current capacity in the electrical wiring section and to prevent detachment due to thermal stress.

As described above, according to the third embodiment, a conducting member having a structure formed by laminating sheet metal is employed. Consequently, it is possible to use a conducting member which has flexibility and increased surface area, the current capacity may be increased in the electrical wiring section, and furthermore, detachment of the junctions due to thermal stress is prevented and improved reliability of the semiconductor module can be achieved.

Fourth Embodiment

Figure 2:
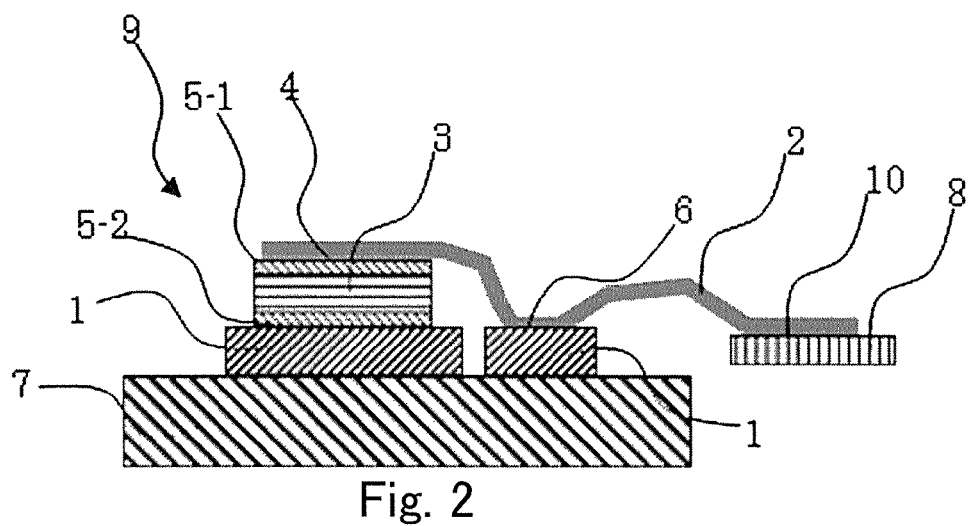
FIG. 2 is a cross-sectional diagram of a semiconductor module according to a fourth embodiment of the present invention.

The fourth embodiment discusses a semiconductor module which is further provided with a configuration that enables the occurrence of residual stress to be suppressed, and improves heat radiating properties, in addition to the configuration shown in FIG. 1. FIG. 2 is a cross-sectional diagram of a semiconductor module according to the fourth embodiment of the present invention. When compared with the configuration in FIG. 1 of the first embodiment described above, the configuration in FIG. 2 differs in being provided with a cooling surface 6 (corresponding to a cooling surface structural part). The explanation given below centers on this different configuration.

The conducting member 2 in the fourth embodiment is connected to the upper-side electrode 5-1 of the semiconductor element 3, the cooling surface 6 of the conducting member 2, and the terminal 8 of the electronic component. Here, for the conducting member 2, it is possible to use any one of the conducting member in which thin metal wires are formed into a strand wire which is described in the first embodiment, the conducting member in which thin metal wires are woven into a mesh shape which is described in the second embodiment, and the conducting member in which metal sheets are laminated which is described in the third embodiment.

The cooling surface 6 which is newly added in the fourth embodiment is insulated with respect to the upper-side electrode 5-1 of the semiconductor element, and is bonded to the substrate 1 or to the heat radiating plate 7, which is actively cooled. By using a structure of this kind, the conducting member 2 is able to absorb dimensional error in the height direction between the semiconductor element 3 and the cooling surface 6. Therefore residual stress does not occur during bonding.

Moreover, by providing a cooling surface 6, it is possible to cool the semiconductor element 3 via the conducting member 2. Consequently, the heat radiating surface area is increased and it is possible to improve the heat radiating properties, while suppressing detachment of the conducting member 2 due to residual stress.

As described above, according to the fourth embodiment, it is possible to obtain similar beneficial effects to the first to third embodiments described above. Moreover, by adopting a configuration provided with a cooling surface, it is possible to suppress the occurrence of residual stress, as well as being able to achieve a semiconductor module having improved heat radiating properties.

Fifth Embodiment

Figure 3:
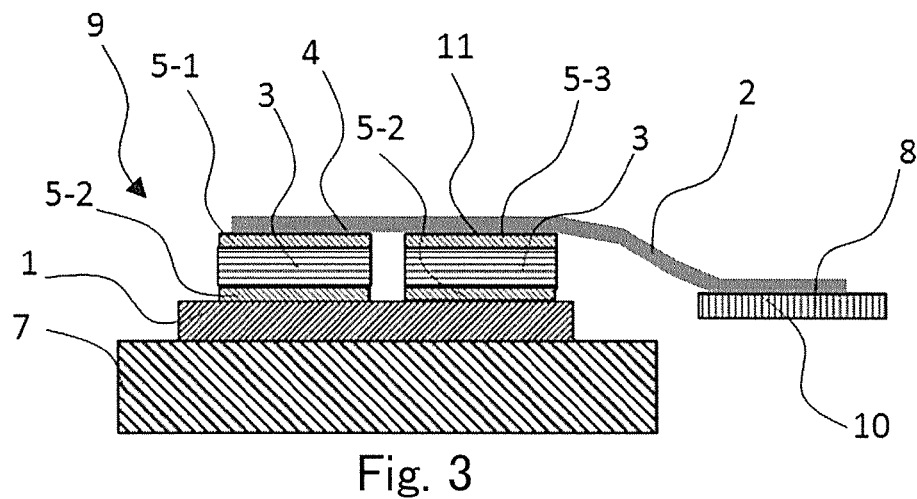
FIG. 3 is a cross-sectional diagram of a semiconductor module according to a fifth embodiment of the present invention.

The fifth embodiment describes a configuration wherein, when a plurality of semiconductor elements 3 are disposed on a substrate 1, the semiconductor elements 3 are connected using the same conducting member 2. FIG. 3 is a cross-sectional diagram of a semiconductor module according to the fifth embodiment of the present invention. When compared with the configuration in FIG. 1 according to the first embodiment described above, the configuration in FIG. 3 differs in that two semiconductor elements 3 are mounted on top of the substrate 1, and these two semiconductor elements 3 are connected commonly by one conducting member 2. The explanation given below centers on this different configuration.

In the semiconductor module 9 according to the fifth embodiment, two or more semiconductor elements 3 are disposed on a substrate 1 (in FIG. 3, there are two semiconductor elements 3), and the two or more semiconductor elements 3 are connected electrically by using the same conducting member 2.

Furthermore, the bonding surface 4 between the conducting member 2 and upper-side electrodes 5-1 of each of the semiconductor elements 3 is bonded by ultrasonic bonding. An ultrasonic bonding device generates heat of friction at the bonding surface and bonds the conducting member 2 and the semiconductor elements 3, by imparting an ultrasonic vibration to the conducting member 2.

For the conducting member 2, it is possible to use any one of the conducting member in which thin metal wires are formed into a strand wire which is described in the first embodiment, the conducting member in which thin metal wires are woven into a mesh shape which is described in the second embodiment, and the conducting member in which metal sheets are laminated which is described in the third embodiment. Furthermore, although not shown in FIG. 3, by bonding the conducting member 2 through providing a cooling surface 6 such as that shown in FIG. 2 according to the fourth embodiment described above, it is also possible to improve the heat radiating properties of the semiconductor elements 3.

As described above, according to the fifth embodiment, it is possible to obtain similar beneficial effects to the first to fourth embodiments described above, by also connecting a plurality of semiconductor elements using the conducting member according to the present invention.

The merits of the conducting member 2 according to the present invention in a case where ultrasonic bonding is used to bond the conducting member 2 and the bonding surface 4 (11) is described here on the basis of a comparison with the prior art. In a conventional semiconductor module in which a bus bar which is a metal plate is bonded ultrasonically to the electrode 5-1 of a semiconductor element 3, during the bonding process, the ultrasonic vibrations in the planar direction of the bus bar are propagated to the bonding surface 11 between the bus bar and the electrode 5-3 of another semiconductor element 3, and hence there is a problem of detachment of the bonding surface 11.

However, in the semiconductor module 9 according to the first to fifth embodiments described above, a conducting member 2 which has flexibility is used instead of a bus bar. Therefore, when the conducting member 2 is bonded ultrasonically to the electrode 5-1 of the semiconductor element 3, it is possible to absorb the ultrasonic vibration by the conducting member 2 which has flexibility. Therefore, it is possible to prevent detachment of the bonding surface 11 between the electrode 5-3 of the semiconductor element 3 and the conducting member 2.

The invention claimed is:

1. A semiconductor module comprising a conducting member, wherein the conducting member electrically connects a semiconductor element arranged on a substrate or a bus bar with another electronic component and is provided with a structure having flexibility capable of, in a junction with the semiconductor element, reducing thermal stress due to difference in a coefficient of linear expansion between the conducting member and the semiconductor element, and absorbing dimensional error in objects to be connected, wherein the semiconductor module further comprises a cooling surface structural part which is insulated from the semiconductor element and is installed on the substrate or the bus bar; and wherein the conducting member is electrically connected to the semiconductor element and the other electronic component via the cooling surface structural part.

2. The semiconductor module according to claim 1, wherein the conducting member is provided with a structure in which metal wires are formed into a strand wire.

3. The semiconductor module according to claim 1,
wherein the conducting member is provided with a structure in which thin metal wires are woven into a mesh shape.

4. The semiconductor module according to claim 1,
wherein the conducting member is provided with a structure in which metal sheets are layered.

5. The semiconductor module according to claim 1,
wherein any one of ultrasonic bonding, solder bonding, Ag sinter bonding, conductive adhesive bonding, diffusion bonding, and brazing bonding, is used as a method for bonding the conducting member to the semiconductor element.

6. The semiconductor module according to claim 2,
wherein any one of ultrasonic bonding, solder bonding, Ag sinter bonding, conductive adhesive bonding, diffusion bonding, and brazing bonding, is used as a method for bonding the conducting member to the semiconductor element.

7. The semiconductor module according to claim 3,
wherein any one of ultrasonic bonding, solder bonding, Ag sinter bonding, conductive adhesive bonding, diffusion bonding, and brazing bonding, is used as a method for bonding the conducting member to the semiconductor element.

8. The semiconductor module according to claim 4,
wherein any one of ultrasonic bonding, solder bonding, Ag sinter bonding, conductive adhesive bonding, diffusion bonding, and brazing bonding, is used as a method for bonding the conducting member to the semiconductor element.

* * * * *